United States Patent
Shimizu et al.

(10) Patent No.: US 10,319,819 B2
(45) Date of Patent: Jun. 11, 2019

(54) SEMICONDUCTOR DEVICE AND METHOD FOR MANUFACTURING THE SAME

(71) Applicant: KABUSHIKI KAISHA TOSHIBA, Minato-ku (JP)

(72) Inventors: Tatsuo Shimizu, Shinagawa (JP); Takashi Shinohe, Yokosuka (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 17 days.

(21) Appl. No.: 15/386,099

(22) Filed: Dec. 21, 2016

(65) Prior Publication Data

US 2017/0104072 A1 Apr. 13, 2017

Related U.S. Application Data

(63) Continuation of application No. PCT/JP2015/065022, filed on May 26, 2015.

(30) Foreign Application Priority Data

Jul. 7, 2014 (JP) .................................. 2014-140041

(51) Int. Cl.
*H01L 29/78* (2006.01)
*H01L 29/16* (2006.01)
(Continued)

(52) U.S. Cl.
CPC ...... *H01L 29/1608* (2013.01); *H01L 21/0214* (2013.01); *H01L 21/046* (2013.01);
(Continued)

(58) Field of Classification Search
CPC ............... H01L 29/045; H01L 29/1608; H01L 29/66674; H01L 29/66704; H01L 29/7395;
(Continued)

(56) References Cited

U.S. PATENT DOCUMENTS 6,482,704 B1    11/2002   Amano et al.
9,324,826 B2     4/2016   Shimizu et al.
(Continued)

FOREIGN PATENT DOCUMENTS

JP   2000-150875 A    5/2000
JP   2001-210637      8/2001
(Continued)

OTHER PUBLICATIONS

International Search Report dated Jul. 7, 2015 in PCT/JP2015/065022 filed May 26, 2015.
(Continued)

*Primary Examiner* — Ahmed N Sefer
(74) *Attorney, Agent, or Firm* — Oblon, McClelland, Maier & Neustadt, L.L.P.

(57) ABSTRACT

A semiconductor device according to an embodiment includes a SiC semiconductor layer, a gate electrode, a gate insulating film provided between the SiC semiconductor layer and the gate electrode, and a region that is provided between the SiC semiconductor layer and the gate insulating film and includes at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu). The concentration of the at least one element is equal to or greater than $1 \times 10^{19}$ cm$^{-3}$ and equal to or less than $2.4 \times 10^{22}$ cm$^{-3}$.

24 Claims, 15 Drawing Sheets

(51) Int. Cl.
  *H01L 21/04* (2006.01)
  *H01L 21/02* (2006.01)
  *H01L 29/04* (2006.01)
  *H01L 29/167* (2006.01)
  *H01L 29/66* (2006.01)
  *H01L 29/739* (2006.01)
  *H01L 21/265* (2006.01)
  *H01L 29/423* (2006.01)

(52) U.S. Cl.
  CPC ...... *H01L 21/049* (2013.01); *H01L 21/26506* (2013.01); *H01L 29/045* (2013.01); *H01L 29/167* (2013.01); *H01L 29/4236* (2013.01); *H01L 29/66068* (2013.01); *H01L 29/7393* (2013.01); *H01L 29/7395* (2013.01); *H01L 29/78* (2013.01); *H01L 29/7802* (2013.01); *H01L 29/7397* (2013.01)

(58) Field of Classification Search
  CPC ....... H01L 29/7397; H01L 2924/01106; H01L 2924/01051; H01L 21/046
  See application file for complete search history.

(56) References Cited

U.S. PATENT DOCUMENTS

| | | |
|---|---|---|
| 2008/0217680 A1 | 9/2008 | Shimizu et al. |
| 2009/0230404 A1* | 9/2009 | Masuda ................ C23C 16/325 257/77 |
| 2012/0326163 A1* | 12/2012 | Dhar .................... H01L 21/049 257/77 |
| 2013/0168699 A1* | 7/2013 | Nakano ................. H01L 21/046 257/77 |
| 2013/0248881 A1* | 9/2013 | Ariyoshi ............. H01L 29/1608 257/77 |
| 2014/0084303 A1 | 3/2014 | Shimizu et al. |
| 2014/0084304 A1 | 3/2014 | Shimizu et al. |
| 2015/0303271 A1* | 10/2015 | Tanaka ................... H01L 29/78 257/77 |

FOREIGN PATENT DOCUMENTS

| | | |
|---|---|---|
| JP | 2008-91421 A | 4/2008 |
| JP | 2010-153586 | 7/2010 |
| JP | 2012-164788 | 8/2012 |
| JP | 2014-67909 A | 4/2014 |
| JP | 2014-67927 | 4/2014 |
| JP | WO2014103186 A1 * | 7/2014 |

OTHER PUBLICATIONS

Jeong Hyun Moon, et al., "Electrical Properties of Atomic-Layer-Deposited $La_2O_3$/Thermal-Nitrided $SiO_2$ Stacking Dielectric on 4H—SiC(0001)", Materials Science Forum, vols. 556-557, 2007, 4 pgs.

Dai Okamoto, et al., "Improved Inversion Channel Mobility in 4H—SiC MOSFETs on Si Face Utilizing Phosphorus-Doped Gate Oxide", IEEE Electron Device Letters, vol. 31, (7), 2010, 3 pgs.

T. Haimoto, et al., "Fabrication and characterization of metal-insulator-semiconductor structures by direct nitridation of InP surfaces", Applied Physics Letters 96, 2010, 4 pgs.

* cited by examiner

SEMICONDUCTOR DEVICE AND METHOD FOR MANUFACTURING THE SAME

CROSS-REFERENCE TO RELATED APPLICATION

This application is continuation application of, and claims the benefit of priority from the International Application PCT/JP2015/65022, filed May 26, 2015, which claims the benefit of priority from Japanese Patent Application No. 2014-140041, filed on Jul. 7, 2014, the entire contents of all of which are incorporated herein by reference.

FIELD

Embodiments described herein relate generally to a semiconductor device and a method for manufacturing the same.

BACKGROUND

Silicon carbide (SiC) is expected to be used as a material for a next-generation semiconductor device. SiC has better physical properties than silicon (Si). For example, the bandgap of SiC is three times more than that of Si, the breakdown field strength of SiC is about ten times more than that of Si, and the thermal conductivity of SiC is about three times more than that of Si. These characteristics are used to achieve a semiconductor device which has low loss and can operate at a high temperature.

However, when SiC is used to form a metal insulator semiconductor (MIS) structure, level density, such as interface state density, between a semiconductor and an insulating film is higher than that of Si. As a result, charge mobility is reduced and the on-resistance of a metal insulator semiconductor field effect transistor (MISFET) or an insulated gate bipolar transistor (IGBT) increases.

DETAILED DESCRIPTION

Figure 1:
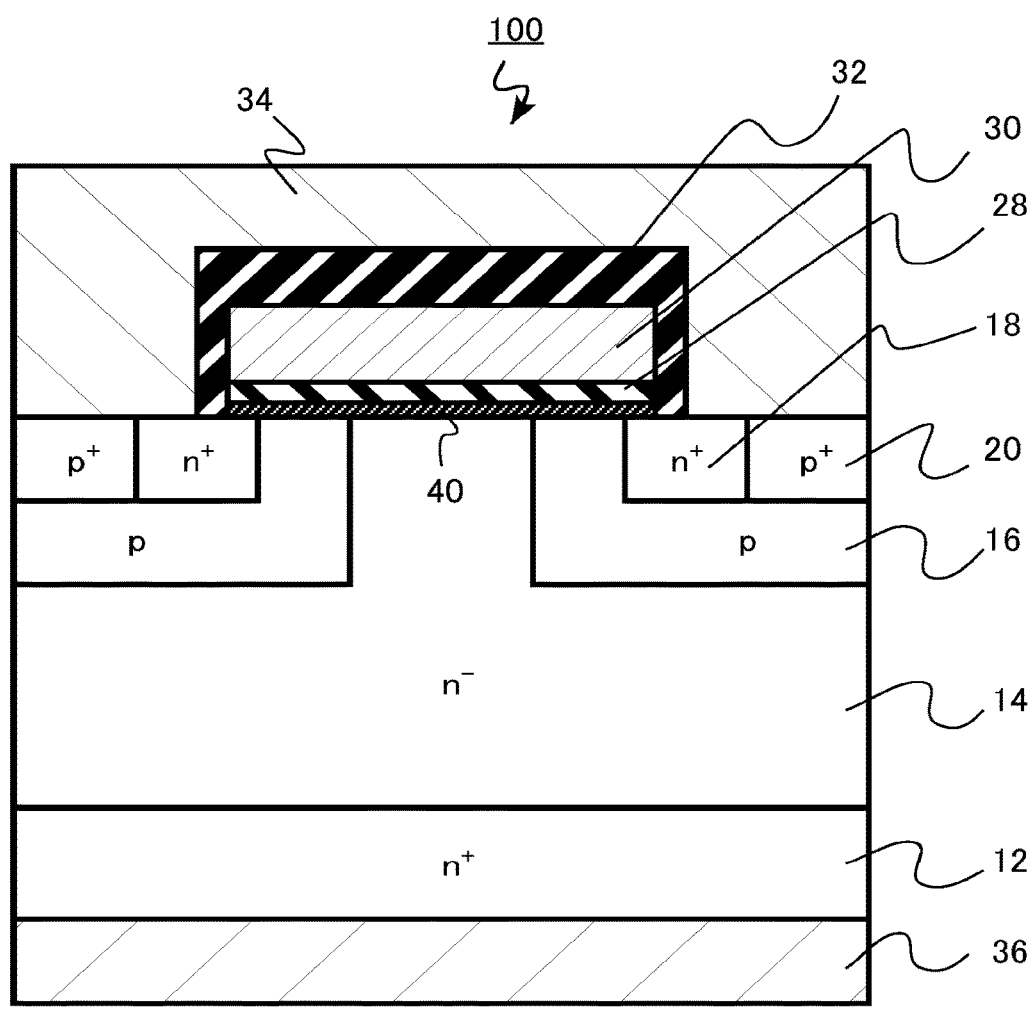
FIG. 1 is a cross-sectional view schematically illustrating a semiconductor device according to a first embodiment.

A semiconductor device according to an embodiment includes, a SiC semiconductor layer, a gate electrode, a gate insulating film provided between the SiC semiconductor layer and the gate electrode, and a region that is provided between the SiC semiconductor layer and the gate insulating film and includes at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu). The concentration of the element is equal to or greater than $1\times10^{19}$ cm$^{-3}$ and equal to or less than $2.4\times10^{22}$ cm$^{-3}$.

Hereinafter, embodiments of the invention will be described with reference to the drawings. In the following description, the same or similar members are denoted by the same reference numerals and the description thereof may not be repeated.

In the following description, n$^+$, n, n$^-$, p$^+$, p, and p$^-$ indicate the relative levels of impurity concentration in each conductivity type. That is, n$^+$ indicates an n-type impurity concentration which is higher than that of n and n$^-$ indicates an n-type impurity concentration which is lower than that of n. In addition, p$^+$ indicates a p-type impurity concentration which is higher than that of p and p$^-$ indicates a p-type impurity concentration which is lower than that of p. In some cases, an n$^+$ type and an n$^-$ type are simply referred to as an n type and a p$^+$ type and a p$^-$ type are simply referred to as a p type.

(First Embodiment)

A semiconductor device according to this embodiment includes, a SiC semiconductor layer, a gate electrode, a gate insulating film provided between the SiC semiconductor layer and the gate electrode; and a region that is provided between the SiC semiconductor layer and the gate insulating film and includes at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu). The concentration of the element is equal to or greater than $1\times10^{19}$ cm$^{-3}$ and equal to or less than $2.4\times10^{22}$ cm$^{-3}$.

Hereinafter, for convenience of explanation, the above-mentioned region is referred to as an interface region. In addition, for convenience of explanation, the element included in the interface region is referred to as a termination element.

FIG. 1 is a cross-sectional view schematically illustrating the structure of a MISFET which is the semiconductor device according to this embodiment. A MISFET 100 is a double implantation MOSFET (DIMOSFET) in which a p well and a source region are formed by ion implantation.

The MISFET 100 includes an n+ SiC substrate 12 having first and second planes. In FIG. 1, the first plane is an upper plane and the second plane is a lower plane.

The SiC substrate 12 is, for example, a 4H—SiC substrate which has nitrogen (N) as n-type impurities and has an impurity concentration that is equal to or greater than $1\times10^{18}$ cm$^{-3}$ and equal to or less than $1\times10^{20}$ cm$^{-3}$.

Figure 2:
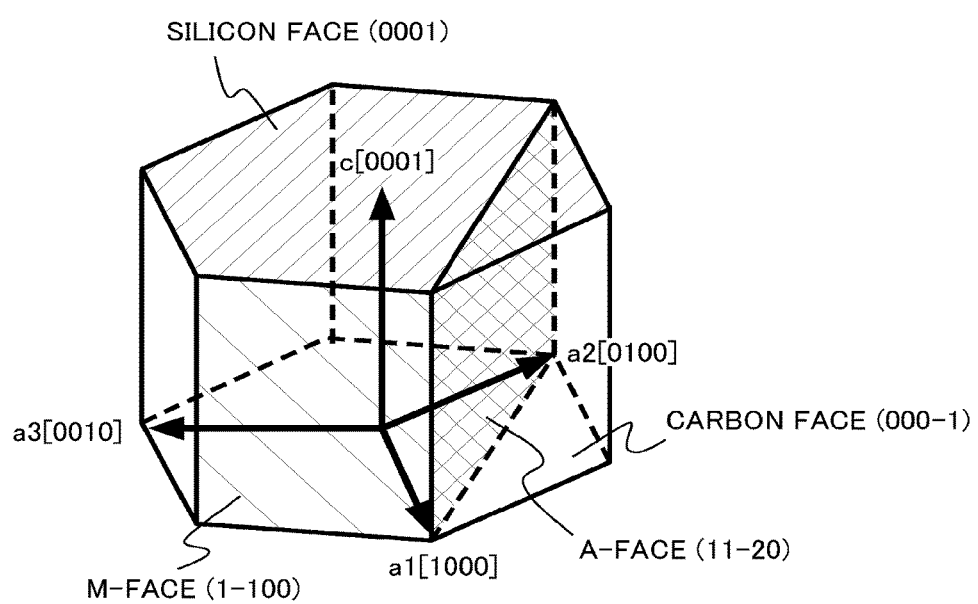
FIG. 2 is a diagram illustrating the crystal structure of a SiC semiconductor according to the first embodiment.

FIG. 2 is a diagram illustrating the crystal structure of a SiC semiconductor. The representative crystal structure of the SiC semiconductor is a hexagonal crystal system such as 4H—SiC. One of the faces (the top faces of a hexagonal cylinder) which are normal to the c-axis along the axial direction of the hexagonal cylinder is a (0001) face. A face equivalent to the (0001) face is referred to as a silicon face and is represented by a {0001} face. Silicon (Si) is arranged in the silicon face.

The other face of the faces (the top faces of the hexagonal cylinder) which are normal to the c-axis along the axial direction of the hexagonal cylinder is a (000-1) face. The face equivalent to the (000-1) face is referred to as a carbon face and is represented by a {000-1} face. Carbon (C) is arranged in the carbon face.

A side face (cylindrical face) of the hexagonal cylinder is an M-face which is equivalent to a (1-100) face, that is, a {1-100} face. A face passing through a pair of ridge lines which are not adjacent to each other is an A-face which is equivalent to a (11-20) face, that is, a {11-20} face. Both silicon (Si) and carbon (C) are arranged on the M-face and the A-face, respectively.

Next, an example in which the first plane of the SiC substrate 12 is inclined at an angle that is equal to or greater than 0 degrees and equal to or less than 8 degrees with respect to the silicon face and the second plane thereof is inclined at an angle that is equal to or greater than 0 degrees and equal to or less than 8 degrees with respect to the carbon face will be described. The plane which is inclined at an angle that is equal to or greater than 0 degrees and equal to or less than 8 degrees with respect to the silicon face and the plane which is inclined at an angle that is equal to or greater than 0 degrees and equal to or less than 8 degrees with respect to the carbon face can be regarded to be substantially the same as the silicon face and the carbon face in terms of characteristics, respectively.

An n$^-$ drift layer 14 having an n-type impurity concentration that is equal to or greater than $5\times10^{15}$ cm$^{-3}$ and equal to or less than $2\times10^{16}$ cm$^{-3}$ is formed on the first plane of the SiC substrate 12. The drift layer 14 is, for example, a SiC epitaxial growth layer that is formed on the SiC substrate 12 by epitaxial growth.

A surface of the drift layer 14 is also inclined at an angle that is equal to or greater than 0 degrees and equal to or less than 8 degrees with respect to the silicon face. The thickness of the drift layer 14 is, for example, equal to or greater than 5 µm and equal to or less than 100 µm.

A p well region 16 of a p type which has a p-type impurity concentration that is, for example, equal to or greater than $5\times10^{15}$ cm$^{-3}$ and equal to or less than $1\times10^{17}$ cm$^{-3}$ is formed in a portion of the surface of the drift layer 14. The depth of the p well region 16 is, for example, about 0.6 µm. The p well region 16 functions as a channel region of the MISFET 100.

An n$^+$ source region 18 having an n-type impurity concentration that is, for example, equal to or greater than $1\times10^{18}$ cm$^{-3}$ and equal to or less than $1\times10^{22}$ cm$^{-3}$ is formed in a portion of the surface of the p well region 16. The depth of the source region 18 is less than the depth of the p well region 16 and is, for example, about 0.3 µm.

A p well contact region 20 of a p$^+$ type which has a p-type impurity concentration that is, for example, equal to or greater than $1\times10^{18}$ cm$^{-3}$ and equal to or less than $1\times10^{22}$ cm$^{-3}$ is formed on the side of the source region 18 in a portion of the surface of the p well region 16. The depth of the p well contact region 20 is less than the depth of the p well region 16 and is, for example, about 0.3 µm.

A gate insulating film 28 is continuously formed on the surfaces of the drift layer 14 and the p well region 16 so as to be laid across the layer and the region. For example, a silicon oxide film or a high-k insulating film can be applied to the gate insulating film 28. It is preferable to apply the silicon oxide film with a wider bandgap than the high-k insulating film in order to reduce the leakage current of the gate insulating film 28.

When an excessive amount of carbon (C) is present in the gate insulating film 28, there is a concern that trap level density which has an adverse effect on the characteristics of the device will increase. Therefore, the carbon (C) concentration of the gate insulating film 28 is preferably equal to or less than $1\times10^{18}$ cm$^{-3}$.

Then, a gate electrode 30 is formed on the gate insulating film 28. For example, doped polysilicon can be applied to the gate electrode 30. An interlayer insulating film 32 which is, for example, a silicon oxide film is formed on the gate electrode 30.

The p well region 16 which is interposed between the source region 18 and the drift layer 14 below the gate electrode 30 functions as a channel region of the MISFET 100.

The gate insulating film 28 is provided between the gate electrode 30 and the drift layer 14. An interface region 40 is provided at the interface between the drift layer 14 and the gate insulating film 28. The interface region 40 includes at least one element (termination element) selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu).

The termination element is segregated at the interface between the drift layer 14 and the gate insulating film 28. The thickness of the interface region 40 is preferably equal to or less than 5 nm. The thickness of the interface region 40 is defined by the full width at half maximum of the peak of the concentration distribution of the termination element.

The concentration of the termination element of the interface region 40 is equal to or greater than $1\times10^{19}$ cm$^{-3}$ and equal to or less than $2.4\times10^{22}$ cm$^{-3}$. The concentration of the termination element of the interface region 40 is preferably equal to or greater than $6.4\times10^{20}$ cm$^{-3}$ and equal to or less than $1.0\times10^{22}$ cm$^{-3}$. The concentration of the termination element of the interface region 40 can be measured by secondary ion mass spectrometry (SIMS). The concentration of the termination element may be represented by maximum concentration of the termination element.

The area density of the termination element of the interface region 40 is equal to or greater than $1\times10^{12}$ cm$^{-2}$ and equal to or less than $2.4\times10^{15}$ cm$^{-2}$. The area density is preferably equal to or greater than $6.4\times10^{13}$ cm$^{-2}$ and equal to or less than $1.0\times10^{15}$ cm$^{-2}$.

The termination element of the interface region 40 substitutes silicon (Si) in the uppermost layer of the drift layer (SiC semiconductor layer) 14 to form a so-called termination structure. In other words, the termination element of the interface region 40 is present at the position of a silicon (Si)

atom at the outermost surface of the drift layer (SiC semiconductor layer) 14, instead of the Si atom. Since the termination element is present in the interface, the termination element is energetically stable. In addition, the concentration of the termination element in the drift layer (SiC semiconductor layer) 14 or the gate insulating film 28 is preferably lower than that at the interface in order to reduce level density that has an adverse effect on the characteristics of the device.

The full width at half maximum of the peak of a concentration distribution of the element is equal to or less than 5 nm and preferably equal to or less than 1 nm. Since Si in the outermost surface is substituted for termination, the full width at half maximum of the peak of the termination element is theoretically equal to or less than 0.5 nm and preferably equal to or less than 0.25 nm. Therefore, the full width at half maximum of the peak of the termination element is preferably equal to or less than 0.5 nm and more preferably equal to or less than 0.25 nm.

A conductive source electrode 34 that is electrically connected to the source region 18 and the p well contact region 20 is provided. The source electrode 34 also functions as a p well electrode that gives potential to the p well region 16.

The source electrode 34 includes, for example, a nickel (Ni) barrier metal layer and an aluminum (Al) metal layer 24 stacked on the barrier metal layer. An alloy may be formed by the reaction between the Ni barrier metal layer and the Al metal layer.

A conductive drain electrode 36 is formed on a surface of the SiC substrate 12 opposite to the drift layer 14, that is, on the second plane. The drain electrode 36 includes, for example, a nickel (Ni) barrier metal layer and the aluminum (Al) metal layer 24 stacked on the barrier metal layer. An alloy may be formed by the reaction between the Ni barrier metal layer and the Al metal layer.

In this embodiment, it is preferable that the n-type impurity be, for example, nitrogen (N) or phosphorus (P). However, the n-type impurity may be, for example, arsenic (As) or antimony (Sb). It is preferable that the p-type impurity be, for example, aluminum (Al). However, the p-type impurity may be, for example, boron (B), gallium (Ga), or indium (In).

Next, the function and effect of the semiconductor device according to this embodiment will be described.

In the MIS structure of the SiC semiconductor, it is considered that one of the causes of difficulty in obtaining high mobility is that the dangling bond of silicon (Si) at the interface is not terminated and an interface state is formed. The inventors examined first principle calculation and the examination result proved that, when silicon (Si) in the surface of the SiC semiconductor layer was substituted with at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu), it was possible to stably terminate the dangling bond. In a state in which Si in the surface of the SiC substrate is substituted, bonds between the above-mentioned elements and carbon, such as Sb—C, Sc—C, Y—C, La—C, lanthanoids element (Ln)-C, are formed. The bond can be confirmed by, for example, X-ray photoelectron spectroscopy (XPS). The bond is characteristic of the interface between a SiC substrate and an insulating film (for example, $SiO_2$) and is not generated at, for example, the interface between a Si substrate and an insulating film.

In this embodiment, the surface of the SiC semiconductor layer is terminated by at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu). Therefore, the interface state of the MIS structure is reduced and high mobility is obtained in a channel portion. As a result, it is possible to achieve a MISFET with low on-resistance.

Figure 3:
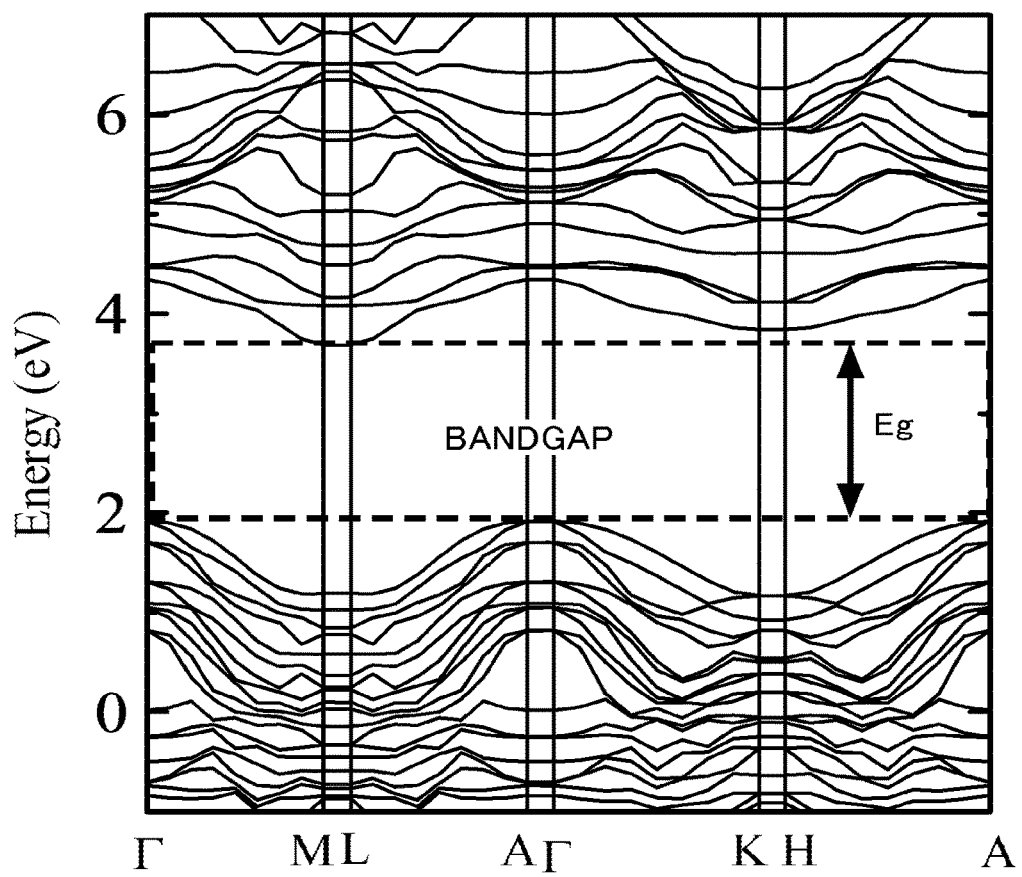
FIG. 3 is a cross-sectional view schematically illustrating a semiconductor device that is being manufactured in a semiconductor device manufacturing method according to a third embodiment.

FIG. 3 is a diagram illustrating an example of a band diagram of the semiconductor device according to this embodiment. A band diagram when the silicon face of the SiC semiconductor is terminated by scandium (Sc) is calculated by the first principle calculation.

As illustrated in FIG. 3, when Sc substitutes Si, the dangling bond of Si is terminated and the interface state caused by the dangling bond in the mid gap between the valence band and the conduction band is disappeared. Then, bandgap energy recovers the bandgap energy of bulk 4H—SiC.

According to the first principle calculation, it has been proved that the termination element according to this embodiment can form a more energetically stable termination structure than hydrogen (H) or nitrogen (N) which has been known as an element terminating the dangling bond. Therefore, for example, a dangling bond is less likely to be generated due to the separation of the termination element even if the semiconductor device is manufactured through a high-temperature process.

When the surface of the SiC semiconductor layer is oxidized, oxygen attacks the back bond of Si and roughness occurs at the interface between SiC and an oxide film. As a result, there is a concern that the reliability of the gate insulating film will be reduced. In addition, carbon (C) is diffused into the oxide film during oxidation and the amount of leakage current increases. As a result, there is a concern that reliability will be reduced. Furthermore, carbon (C) vacancies are generated in the SiC semiconductor layer during oxidation and a trap level is formed. As a result, there is a concern that the mobility of the MISFET will be reduced.

According to this embodiment, the termination element substitutes Si in the outermost surface of the SiC semiconductor layer and the stable interface region 40 is formed. The stable interface region 40 prevents the SiC semiconductor layer from being further oxidized even if the SiC semiconductor layer is exposed in an oxidizing atmosphere. Therefore, the roughness of the interface or the diffusion of carbon (C) to the oxide film is prevented. As a result, an increase in the leakage current of the gate insulating film or a reduction in reliability is prevented. In addition, the formation of a carbon (C) vacancy is prevented and a reduction in the mobility of the MISFET is prevented.

For example, when the dangling bond of the surface of the SiC semiconductor is terminated by an element, such as nitrogen (N) or phosphorous (P), having a smaller covalent radius or a smaller ion radius at the same coordination number than Si or an element, such as arsenic (As), having the same covalent radius or the same ion radius at the same coordination number as Si, there is a concern that the termination element will be diffused to the SiC semiconductor or the gate insulating film and the characteristics of the device will deteriorate.

Specifically, when the termination element is diffused to the SiC semiconductor, it acts as a dopant. As a result, for example, the threshold voltage of the MISFET varies. In addition, when the termination element is diffused to the gate insulating film, a trap level is formed in the gate insulating film. As a result, for example, the threshold voltage of the MISFET varies or mobility is reduced.

All of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu), which are the termination elements according to this embodiment, have a larger covalent radius or a larger ion radius at the same coordination number than Si. For example, while the covalent radius of silicon (Si) is 1.18 angstroms, the covalent radius of antimony (Sb) which has the smallest covalent radius among the above-mentioned elements is 1.43 angstroms which is 20% or more greater than the covalent radius of Si.

In this embodiment, since the radius of the element is large, the termination element is less likely to be diffused to the SiC semiconductor or the gate insulating film. Therefore, a trap level is less likely to be formed in the SiC semiconductor or the gate insulating film 28. As a result, for example, a variation in the threshold voltage of the MISFET or a reduction in mobility is less likely to occur.

The termination element according to this embodiment is more likely to form silicate than, for example, nitrogen (N), phosphorous (P), and arsenic (As). Therefore, even if the termination element is diffused to the gate insulating film 28 having Si as a main component, such as a silicon oxide film, the termination element is likely to form silicate and to be stabilized. From this point of view, the termination element is less likely to form a trap level in the gate insulating film 28.

When the termination structure is formed on the plane inclined at an angle that is equal to or greater than 0 degrees and equal to or less than 8 degrees with respect to the silicon face as in this embodiment, it is preferable that the termination element be antimony (Sb) or scandium (Sc) which has a radius relatively close to that of Si and is likely to substitute Si, in order to easily form the termination structure. It is preferable that the termination element be lanthanum (La) or yttrium (Y) having an energetically stable termination structure, in terms of the stability of the termination structure.

The area density of the termination element in the interface region 40 is preferably equal to or greater than $1\times10^{12}$ cm$^{-2}$ and equal to or less than $2.4\times10^{15}$ cm$^{-2}$. An area density of $1\times10^{12}$ cm$^{-2}$ is general interface state density and it is considered that a termination element having area density that is equal to or greater than the above-mentioned value is required. When the area density is less than the above-mentioned range, the termination of the dangling bond is insufficient and it is difficult to achieve high mobility. The area density of Si in the silicon face, that is, the number of Si atoms to be substituted defines the upper limit of the above-mentioned range.

It is preferable that the interface region 40 substituted with the termination element be a monolayer. Therefore, the thickness of the interface region 40 is preferably equal to or less than 1 nm. On the assumption that the termination elements corresponding to the area density are diffused to the interface region 40 with a thickness of 1 nm, the concentration of the termination elements is equal to or greater than $1\times10^{19}$ cm$^{-3}$ and equal to or less than $2.4\times10^{22}$ cm$^{-3}$.

The result of the first principle calculation proves that one third of the Si atoms particularly in the silicon face are substituted with the termination elements in order to obtain an energetically stable state. Therefore, the area density of the termination elements is preferably equal to or greater than $6.4\times10^{13}$ cm$^{-2}$ and equal to or less than $1.0\times10^{15}$ cm$^{-2}$ in a state in which one third of the Si atoms are substituted, in order to form the stable interface region 40. The lower limit is set on the assumption that 10% of 30% of the dangling bonds are terminated, that is, about 3% of the dangling bonds are terminated and the upper limit is set on the assumption that 30% of the dangling bonds are terminated. On the assumption that the thickness of the interface region 40 is 1 nm, the concentration of the termination elements in the interface region 40 is preferably equal to or greater than $6.4\times10^{20}$ cm$^{-3}$ and equal to or less than $1.0\times10^{22}$ cm$^{-3}$.

In addition, the area density of the termination elements is preferably equal to or greater than $2.0\times10^{14}$ cm$^{-2}$ and equal to or less than $1.0\times10^{15}$ cm$^{-2}$. The lower limit is set on the assumption that 10% of the dangling bonds are terminated and the upper limit is set on the assumption that 30% of the dangling bonds are terminated. On the assumption that the thickness of the interface region 40 is 1 nm, the concentration of the termination elements in the interface region 40 is preferably equal to or greater than $2.0\times10^{21}$ cm$^{-3}$ and equal to or less than $1.0\times10^{22}$ cm$^{-3}$.

It is more preferable that the area density of the termination elements be equal to or greater than $6.4\times10^{14}$ cm$^{-2}$ and equal to or less than $1.0\times10^{15}$ cm$^{-2}$. The lower limit is set on the assumption that 30% of the dangling bonds are terminated and the upper limit is set on the assumption that 30% of the dangling bonds are terminated. On the assumption that the thickness of the interface region 40 is 1 nm, the concentration of the termination elements in the interface region 40 is preferably equal to or greater than $6.4\times10^{21}$ cm$^{-3}$ and equal to or less than $1.0\times10^{22}$ cm$^{-3}$.

The best mode of the area density of the termination elements is equal to or greater than $7.2\times10^{14}$ cm$^{-2}$ and equal to or less than $8.8\times10^{14}$ cm$^{-2}$. The lower limit is set on the assumption that 30% of the dangling bonds are terminated and the upper limit is set on the assumption that 30% of the dangling bonds are terminated. An error of 10% is assumed. On the assumption that the thickness of the interface region 40 is 1 nm, the concentration of the termination elements in the interface region 40 is preferably equal to or greater than $7.2\times10^{21}$ cm$^{-3}$ and equal to or less than $8.8\times10^{21}$ cm$^{-3}$. In this embodiment, a deposition process is adjusted to obtain an optimum value of $8.0\times10^{21}$ cm$^{-3}$.

As described above, according to this embodiment, the interface state between the SiC semiconductor layer and the gate insulating film and the trap level in the SiC semiconductor layer and the gate insulating film are reduced and a MISFET with high mobility is achieved. In addition, a trap level or the amount of carbon (C) in the gate insulating film is reduced. The roughness of the interface between the SiC semiconductor layer and the gate insulating film is reduced. Therefore, the leakage current of the gate insulating film is reduced and the reliability of the gate insulating film is improved. In addition, a variation in the threshold voltage (for example, a reduction in the threshold voltage) due to the diffusion of the termination element to the SiC semiconductor layer is prevented. Therefore, the MISFET 100 with a high operation performance and high reliability is achieved.

(Second Embodiment)

A semiconductor device according to this embodiment differs from the semiconductor device according to the first embodiment in that a surface of a drift layer is inclined at an angle that is equal to or greater than 0 degrees and equal to or less than 8 degrees with respect to a {1-100} face (M-face) or a {11-20} face (A-face). The description of the same content as that in the first embodiment will not be repeated.

A MISFET according to this embodiment has the same structure as that illustrated in FIG. 1. Next, the MISFET according to this embodiment will be described with reference to FIG. 1.

In the MISFET according to this embodiment, a first plane of a SiC substrate 12 and a surface of the drift layer 14 are inclined at an angle that is equal to or greater than 0 degrees and equal to or less than 8 degrees with respect to the {1-100} face (M-face) or the {11-20} face (A-face).

An interface region 40 is provided at the interface between a drift layer 14 and a gate insulating film 28. The interface region 40 includes at least one element (termination element) selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu).

In addition, the interface region 40 includes nitrogen (N). The nitrogen (N) concentration of the interface region 40 is preferably higher than the concentration of the termination element.

Both silicon (Si) and carbon (C) are exposed from the M-face and the A-face. In order to terminate the dangling bond in the surface, Si is substituted with the termination element having a larger radius than Si and C is substituted with N with a smaller radius than C. As a result, the distortion of the surface is reduced and a termination structure is stabilized. The nitrogen (N) concentration of the interface region 40 is preferably higher than the concentration of the termination element in order to improve stability.

According to this embodiment, when the M-face or the A-face is used for the SiC semiconductor layer, it is possible to form the interface region 40 with high stability. Therefore, a MISFET 200 in which level density, such as interface state density, is maintained at a low value and which has high mobility is achieved.

(Third Embodiment)

A semiconductor device manufacturing method according to this embodiment implants ions of at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) into a SiC semiconductor layer, forms a thermally oxidized film on a surface of the SiC semiconductor layer, forms a gate insulating film on the surface side of the SiC semiconductor layer, and forms a gate electrode on the gate insulating film. The semiconductor device manufacturing method according to this embodiment is an example of a method for manufacturing the semiconductor device according to the first embodiment.

FIGS. 4 to 8 are cross-sectional views schematically illustrating a semiconductor device that is being manufactured in the semiconductor device manufacturing method according to this embodiment.

First, the n+ SiC substrate 12 having the first plane which is the silicon face and the second plane which is the carbon face is prepared. Then, the n− drift layer (SiC semiconductor layer) 14 is formed on the first plane of the SiC substrate 12 by an epitaxial growth method. The surface of the drift layer 14 is also inclined at an angle that is equal to or greater than 0 degrees and equal to or less than 8 degrees with respect to the silicon face.

Then, the p well region 16 of a p type, the n+ source region 18, and the p well contact region 20 of a p+ type are formed by a known photolithography method and a known ion implantation method.

Figure 4:
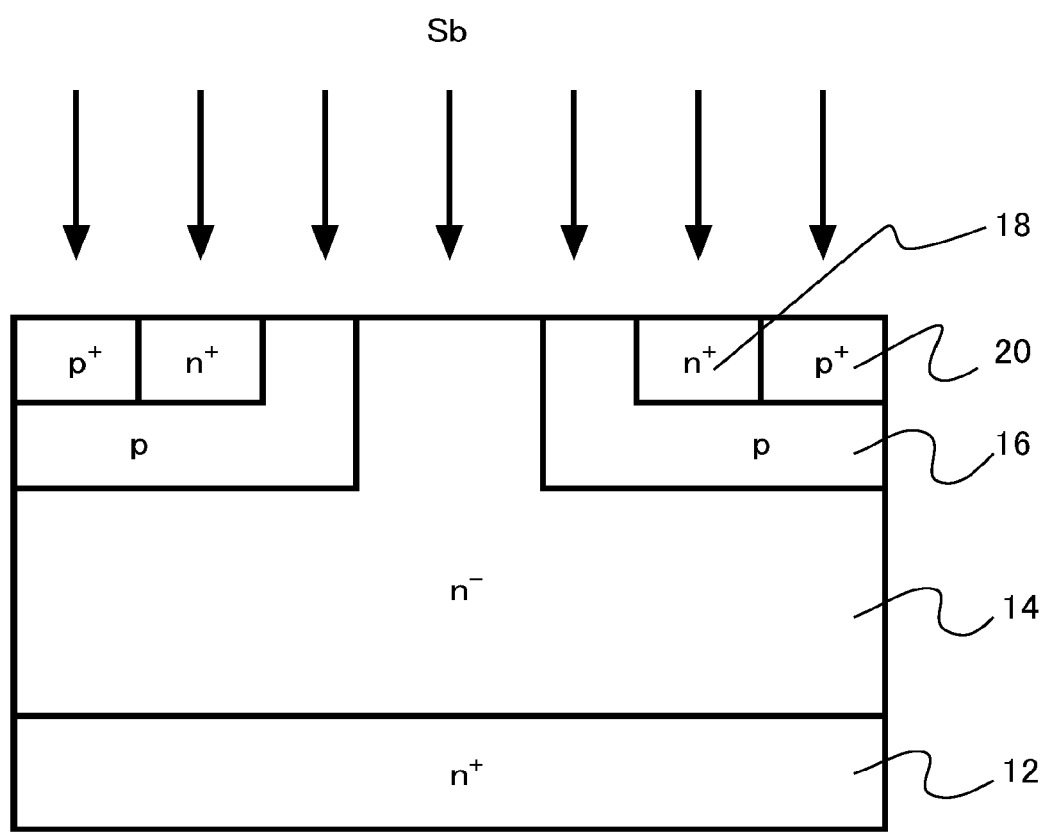
FIG. 4 is a cross-sectional view schematically illustrating the semiconductor device manufacturing method according to the third embodiment.

Then, ions of at least one element (termination element) which is selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) are implanted into the n− drift layer (SiC semiconductor layer) 14 (FIG. 4). Next, antimony (Sb) will be described as an example of the termination element.

Before Sb ions are implanted, a cap film which is an insulating film, such as a silicon oxide film, may be provided on the surface of the drift layer 14. Sb ions are implanted through the cap film, which makes it easy to distribute Sb in the ion-implanted drift layer 14 to the vicinity of the surface of the drift layer 14.

Figure 5:
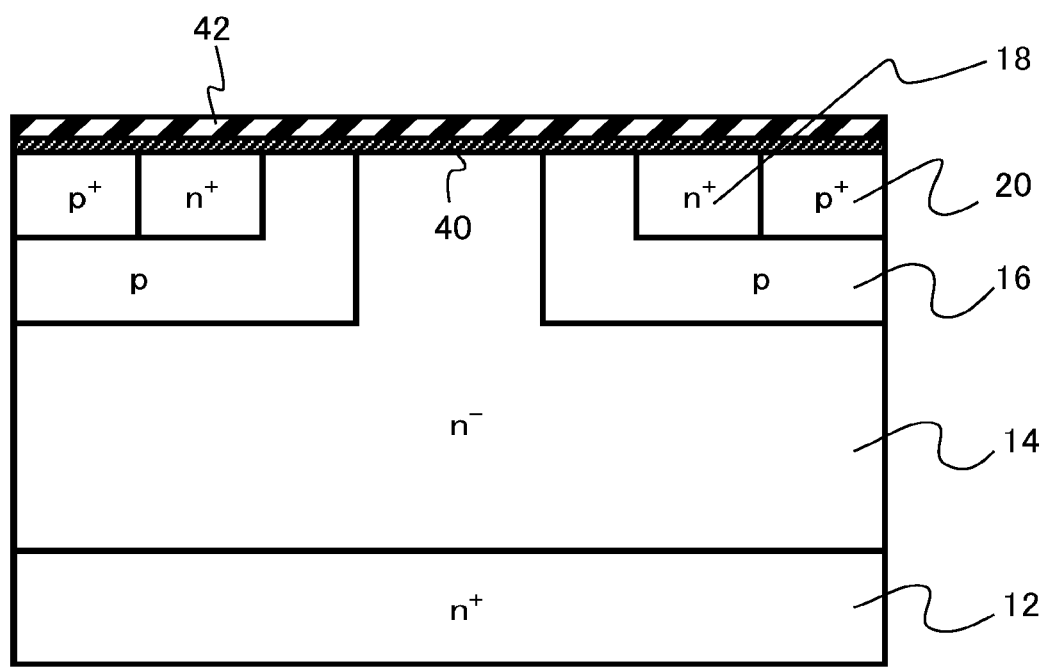
FIG. 5 is a cross-sectional view schematically illustrating the semiconductor device manufacturing method according to the third embodiment.

Then, a thermally oxidized film 42 is formed on the n− drift layer (SiC semiconductor layer) 14 (FIG. 5). When the thermally oxidized film 42 is formed, Sb which has been introduced into the drift layer 14 by ion implantation is segregated at the interface between the drift layer 14 which is energetically stable and the thermally oxidized film 42 to form the interface region 40. Specifically, Sb substitutes Si at the interface between the drift layer 14 and the thermally oxidized film 42 and is distributed in the interface at high concentration. At that time, it is preferable to perform thermal oxidation such that almost all of the Sb ions implanted into the SiC are moved to the interface region 40 or the thermally oxidized film 42. That is, it is preferable that the entire region into which the Sb ions has been implanted be thermally oxidized into the interface region 40 or the thermally oxidized film 42.

Figure 6:
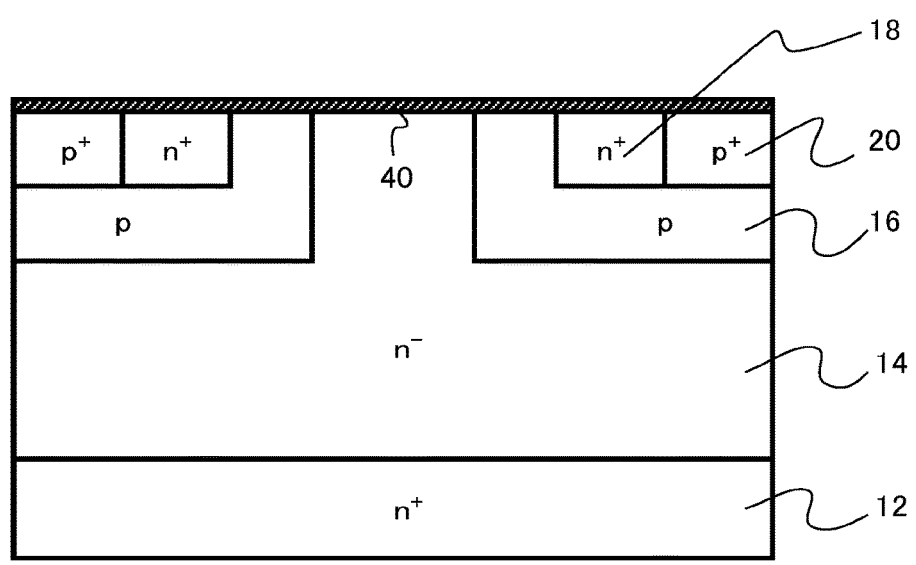
FIG. 6 is a cross-sectional view schematically illustrating the semiconductor device manufacturing method according to the third embodiment.
Figure 7:
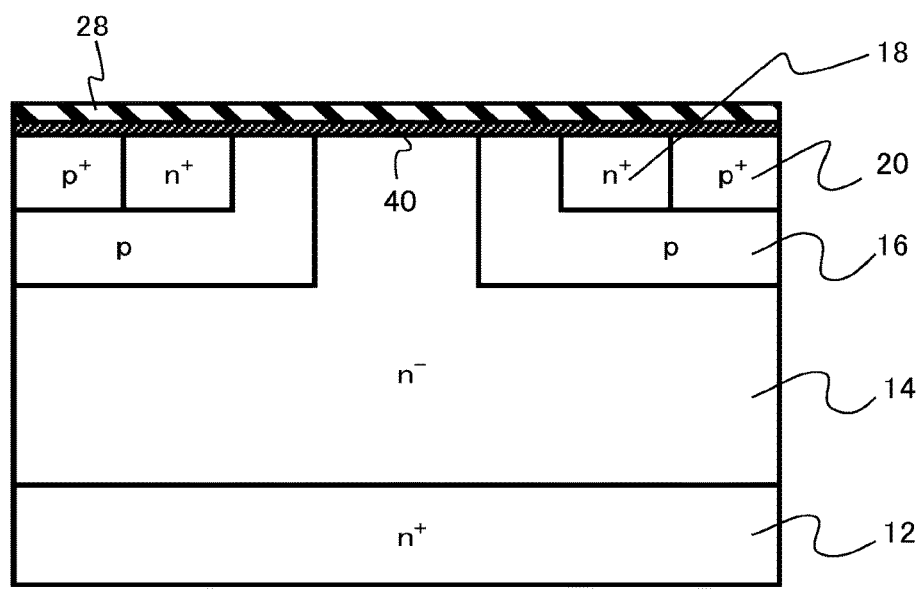
FIG. 7 is a cross-sectional view schematically illustrating the semiconductor device manufacturing method according to the third embodiment.

Then, at least a portion of the thermally oxidized film 42 is removed by, for example, a known wet etching method (FIG. 6). Here, an example in which the entire thermally oxidized film 42 is removed in the thickness direction will be described. In addition, the thickness of the interface region 40 may be reduced to an appropriate value by etching. The thickness of the interface region 40 which remains after etching is about 0.25 nm which is enough to substitute Si in the outermost surface with Sb. Here, it is assumed that the thickness of the interface region 40 which remains after etching is about 1 nm.

Then, the gate insulating film 28 is formed on the interface region 40 formed on the surface side of the drift layer (SiC semiconductor layer) 14. The gate insulating film 28 is a silicon oxide film which is formed by, for example, a low pressure chemical vapor deposition (LPCVD) method.

After the gate insulating film 28 is formed, annealing for densifying the gate insulating film 28 may be performed. The annealing is performed in an inert gas atmosphere, such as a nitrogen atmosphere or an argon atmosphere.

Figure 8:
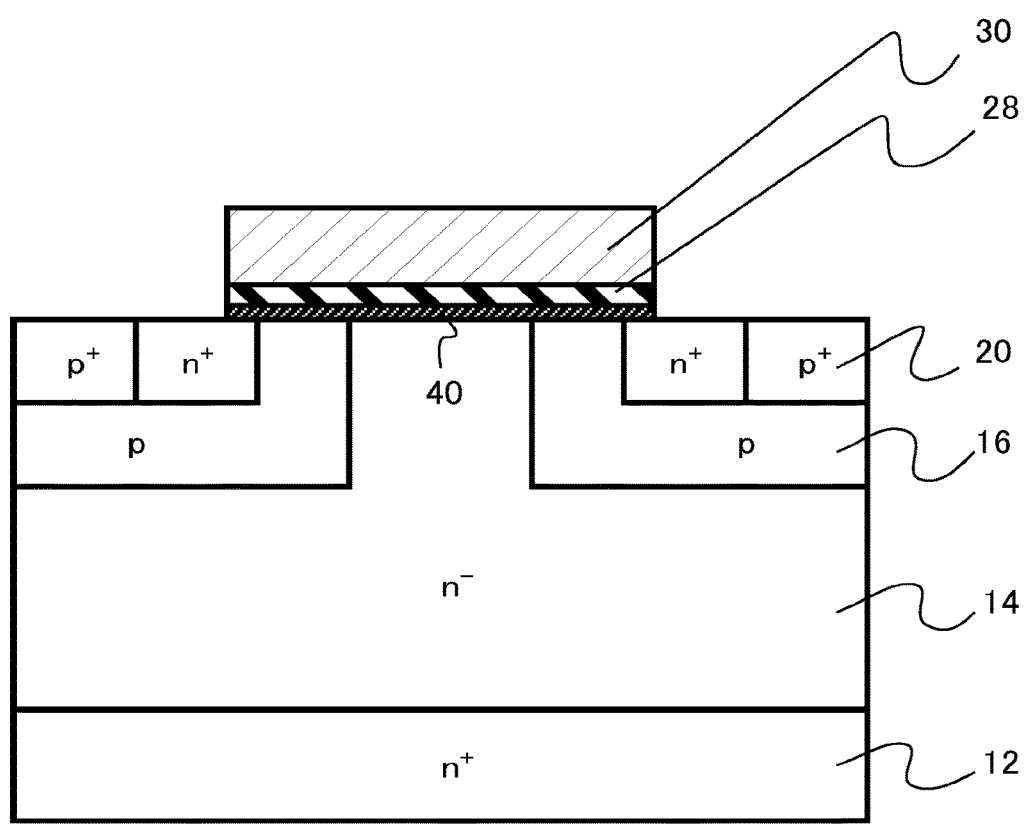
FIG. 8 is a cross-sectional view schematically illustrating the semiconductor device manufacturing method according to the third embodiment.

Then, the gate electrode 30 is formed on the gate insulating film 28 by a known method (FIG. 8). The gate electrode 30 is, for example, a doped polysilicon film which is formed by the LPCVD method.

Then, the interlayer insulating film 32, the source electrode 34, and the drain electrode 36 are formed by a known process. In this way, the MISFET 100 according to this embodiment illustrated in FIG. 1 is manufactured.

It is preferable to remove the thermally oxidized film 42 in order to remove the carbon or the termination element diffused to the thermally oxidized film 42 and to reduce the trap level in the insulating film. However, the thermally oxidized film 42 may not be removed and the gate insulating film 28 may be formed on the thermally oxidized film 42. Alternatively, the thermally oxidized film 42 may function as the gate insulating film.

A MISFET having a high operation performance and high reliability is achieved by the manufacturing method according to this embodiment.

(Fourth Embodiment)

A semiconductor device manufacturing method according to this embodiment forms a film including at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) on a surface of a SiC semiconductor layer, forms a gate insulating film on the surface side of the SiC semiconductor layer, and forms a gate electrode on the gate insulating film. The semiconductor device manufacturing method according to this embodiment is an example of a method for manufacturing the semiconductor device according to the first embodiment.

Figure 9:
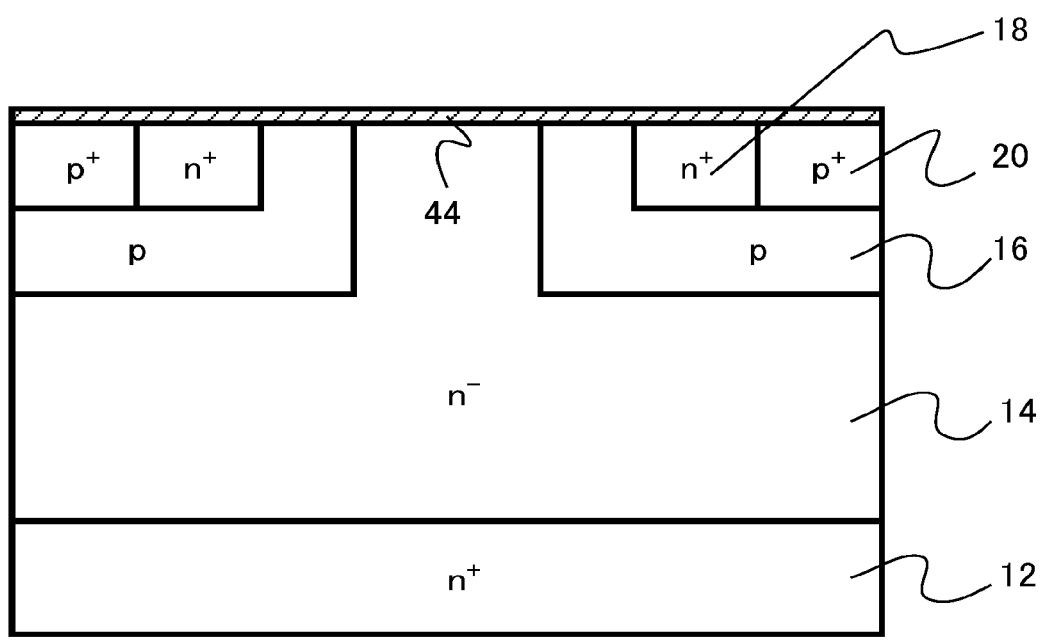
FIG. 9 is a cross-sectional view schematically illustrating a semiconductor device manufacturing method according to a fourth embodiment.
Figure 10:
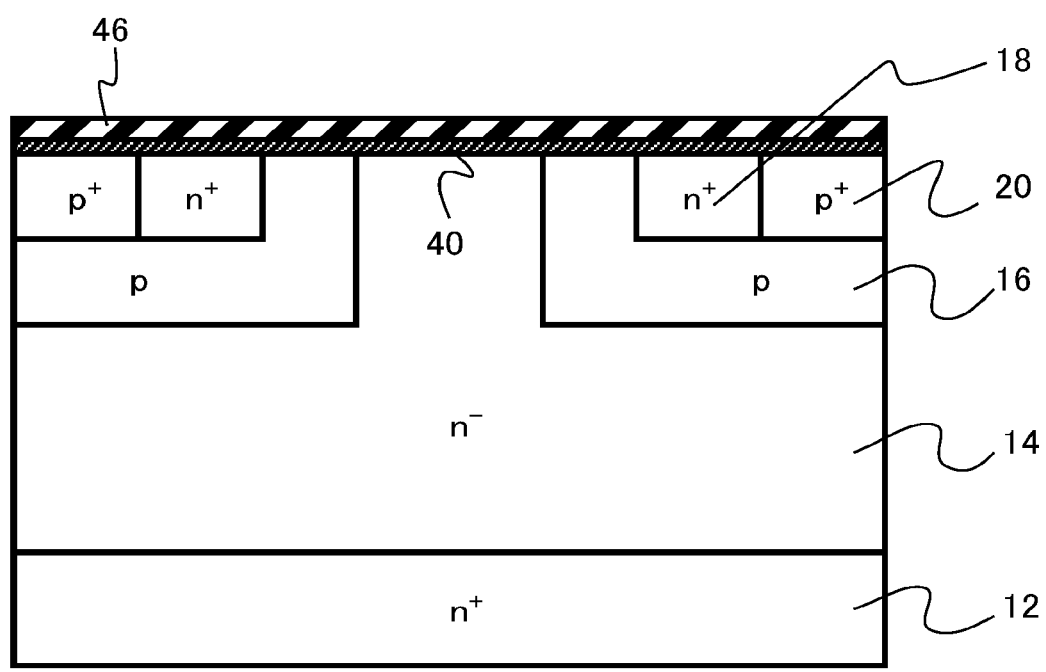
FIG. 10 is a cross-sectional view schematically illustrating the semiconductor device manufacturing method according to the fourth embodiment.
Figure 11:
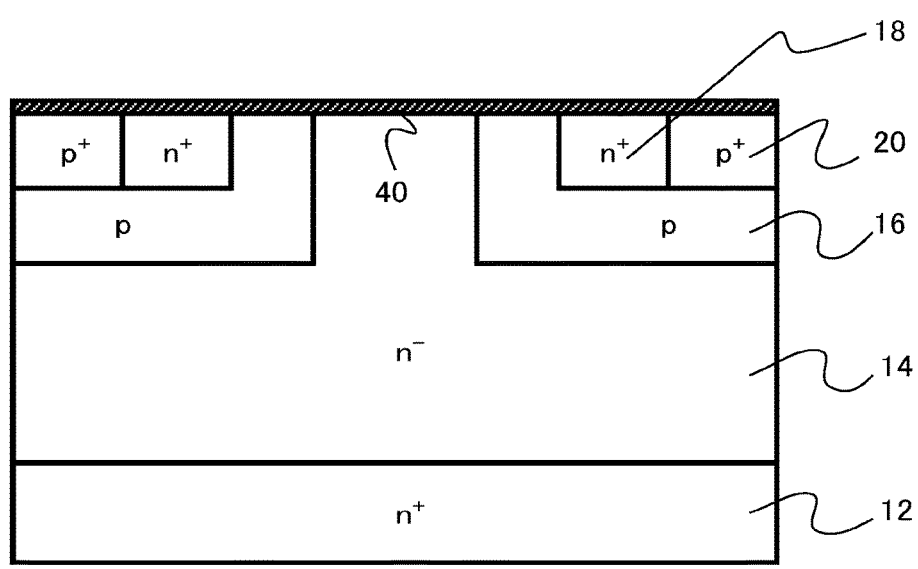
FIG. 11 is a cross-sectional view schematically illustrating the semiconductor device manufacturing method according to the fourth embodiment.

FIGS. 9 to 11 are cross-sectional views schematically illustrating the semiconductor device that is being manufactured in the semiconductor device manufacturing method according to this embodiment.

First, the $n^+$ SiC substrate 12 having the first plane which is the silicon face and the second plane which is the carbon face is prepared. Then, the $n^-$ drift layer (SiC semiconductor layer) 14 is formed on the first plane of the SiC substrate 12 by an epitaxial growth method. The surface of the drift layer 14 is also inclined at an angle that is equal to or greater than 0 degrees and equal to or less than 8 degrees with respect to the silicon face.

After the $n^-$ drift layer (SiC semiconductor layer) 14 is formed on the SiC substrate 12, the p well region 16 of a p type, the $n^+$ source region 18, and the p well contact region 20 of a $p^+$ type are formed by a known photolithography method and a known ion implantation method. The above-mentioned processes are the same as those in the third embodiment.

Then, a film (termination element containing film) 44 including at least one element (termination element) which is selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) is formed on the $n^-$ drift layer (SiC semiconductor layer) 14 (FIG. 9). The film including the termination element is, for example, a single-element film including the termination element. The single-element film is, for example, a metal film. Next, lanthanum (La) will be described as an example of the termination element.

As the termination element containing film 44, a single-element film including La (La film) is formed on the surface of the drift layer 14. The La film is formed by, for example, a known sputtering method. The La film may be formed by a vapor deposition method or a molecular beam epitaxy (MBE) method.

Then, the termination element containing film 44 is thermally oxidized to form a thermally oxidized film 46 (FIG. 10). When the thermally oxidized film 46 is formed, La in the termination element containing film 44 is segregated at the interface between the drift layer 14 which is energetically stable and the thermally oxidized film 46 to form the interface region 40. Specifically, La substitutes Si at the interface between the drift layer 14 and the thermally oxidized film 46 and is distributed in the interface at high concentration.

Then, at least a portion of the thermally oxidized film 46 is removed by, for example, a known wet etching method (FIG. 11). Here, an example in which the entire thermally oxidized film 46 is removed will be described. In addition, the thickness of the interface region 40 may be appropriately reduced by etching. The thickness of the interface region 40 which remains after etching is about 0.25 nm, which is enough to substitute Si in the outermost surface with La. Here, it is assumed that the thickness of the interface region 40 which remains after etching is about 0.5 nm.

Then, the gate insulating film 28 is formed on the interface region 40 on the surface side of the drift layer (SiC semiconductor layer) 14, similarly to the third embodiment. In addition, the gate electrode 30 is formed on the gate insulating film 28.

Then, the interlayer insulating film 32, the source electrode 34, and the drain electrode 36 are formed by a known process. In this way, the MISFET 100 according to this embodiment illustrated in FIG. 1 is manufactured.

When the surface of the drift layer 14 is a plane from which carbon (C) is exposed, such as the M-face and the A-face, it is preferable that the termination element containing film 44 be thermally nitrided to form an oxynitride film. Carbon (C) at the interface is substituted with nitrogen (N) in order to reduce deterioration and to stabilize the interface region 40. A side surface of a trench structure may be the M-face or the A-face. In this case, the same effect as described above is obtained.

It is preferable to remove the thermally oxidized film 46 in order to remove the carbon or the termination element diffused to the thermally oxidized film 46 and to reduce the trap level in the insulating film. However, the thermally oxidized film 46 may not be removed and the gate insulating film 28 may be formed on the thermally oxidized film 46. Alternatively, the thermally oxidized film 42 may function as the gate insulating film.

A MISFET having a high operation performance and high reliability is achieved by the manufacturing method according to this embodiment. In addition, according to the manufacturing method of this embodiment, the concentration of the termination elements in the SiC semiconductor layer 14 can be less than that in the third embodiment using, for example, the ion implantation method. Therefore, it is possible to prevent a variation in the threshold voltage of the MISFET 100 or a reduction in mobility.

(Fifth Embodiment)

A semiconductor device manufacturing method according to this embodiment differs from the semiconductor device manufacturing method according to the fourth embodiment in that the termination element containing film 44 is a silicate film and the termination element containing film 44 is not thermally oxidized. The semiconductor device manufacturing method according to this embodiment is an example of a method for manufacturing the semiconductor device according to the first embodiment.

Figure 12:
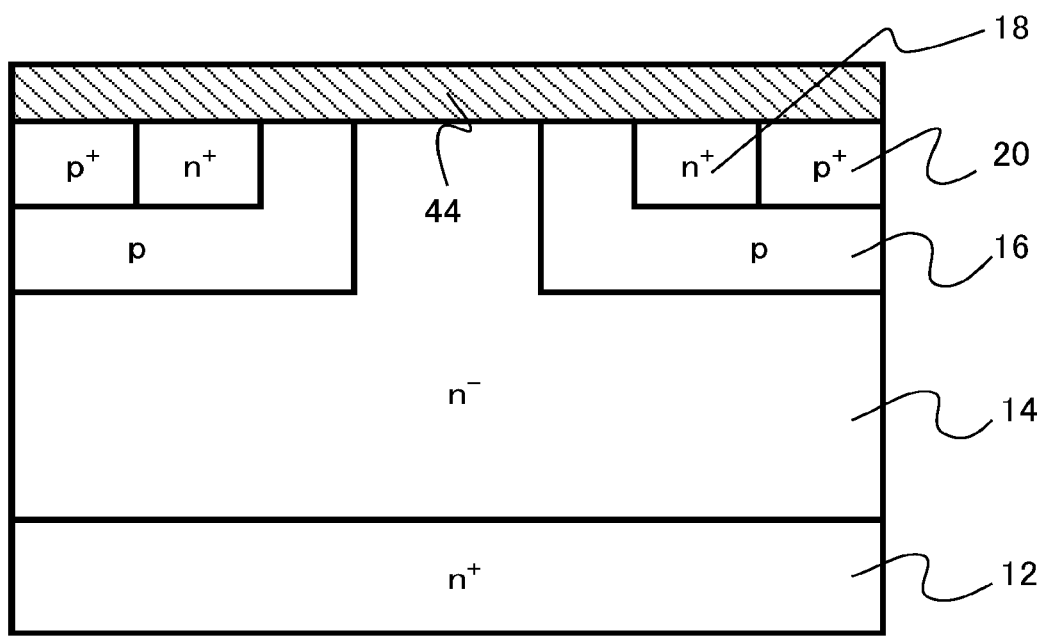
FIG. 12 is a cross-sectional view schematically illustrating a semiconductor device manufacturing method according to a fifth embodiment.
Figure 13:
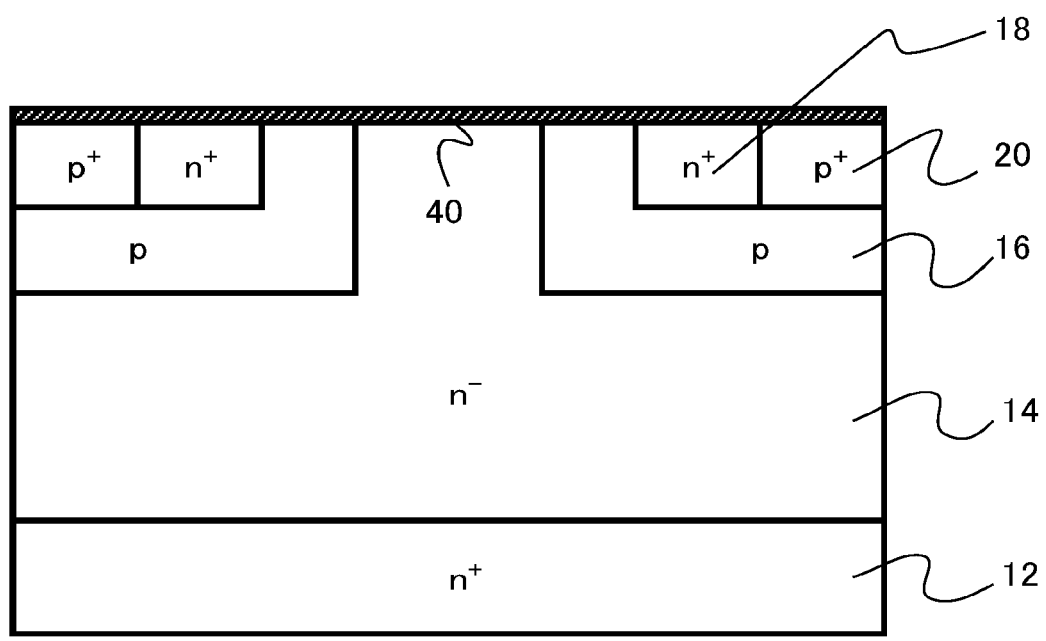
FIG. 13 is a cross-sectional view schematically illustrating the semiconductor device manufacturing method according to the fifth embodiment.

FIGS. 12 and 13 are cross-sectional views schematically illustrating the semiconductor device that is being manufactured in the semiconductor device manufacturing method according to this embodiment.

First, the $n^+$ SiC substrate 12 having the first plane which is the silicon face and the second plane which is the carbon face is prepared. Then, the $n^-$ drift layer (SiC semiconductor layer) 14 is formed on the first plane of the SiC substrate 12 by an epitaxial growth method. The surface of the drift layer 14 is also inclined at an angle that is equal to or greater than 0 degrees and equal to or less than 8 degrees with respect to the silicon face.

After the $n^-$ drift layer (SiC semiconductor layer) 14 is formed on the SiC substrate 12, the p well region 16 of a p type, the $n^+$ source region 18, and the p well contact region 20 of a $p^+$ type are formed by a known photolithography method and a known ion implantation method. The above-mentioned processes are the same as those in the fourth embodiment.

Then, a film (termination element containing film) 44 including at least one element (termination element) which is selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) is formed on the n⁻ drift layer (SiC semiconductor layer) 14 (FIG. 12). The film including the termination element is, for example, a silicate film of the termination element. Next, scandium (Sc) will be described as an example of the termination element.

As the termination element containing film 44, a Sc silicate film (ScSiO film) is formed on the surface of the drift layer 14. The ScSiO film is formed by, for example, a known sputtering method.

Then, the termination element containing film 44 is removed by etching (FIG. 13). The etching is performed by a known dry etching method or a known wet etching method.

When the termination element containing film 44 is etched, Sc in the termination element containing film 44 is segregated on the surface of the drift layer 14 which is energetically stable to form the interface region 40. Specifically, Sc substitutes Si in the surface of the drift layer 14 and is distributed in the interface at high concentration.

An interface termination structure by the termination element is very energetically stable. Therefore, when Sc atoms are freely moved by the etching of the termination element containing film 44, they are moved to a Si substitution site of the outermost surface of the drift layer 14 so as to form the interface termination structure. Then, a state in which Sc is segregated at the interface is formed.

Then, the gate insulating film 28 is formed on the interface region 40 on the surface side of the drift layer (SiC semiconductor layer) 14, similarly to the fourth embodiment. In addition, the gate electrode 30 is formed on the gate insulating film 28.

Then, the interlayer insulating film 32, the source electrode 34, and the drain electrode 36 are formed by a known process. In this way, the MISFET 100 according to this embodiment illustrated in FIG. 1 is manufactured.

A MISFET having a high operation performance and high reliability is achieved by the manufacturing method according to this embodiment. In addition, according to the manufacturing method of this embodiment, the concentration of the termination elements in the SiC semiconductor layer 14 can be less than that in the third embodiment using, for example, the ion implantation method. Therefore, it is possible to prevent a variation in the threshold voltage of the MISFET 100 or a reduction in mobility.

The silicate film is stable as an amorphous film and the trap level in the silicate film is low. In addition, the silicate film has a higher permittivity than a silicon oxide film. Therefore, it is possible to achieve the MISFET 100 which has a small amount of gate leakage current and high gate controllability.

(Sixth Embodiment)

A semiconductor device according to this embodiment is similar to the semiconductor device according to the first embodiment except that it is a trench gate MISFET. Therefore, the description of the same content as that in the first embodiment will not be repeated.

Figure 14:
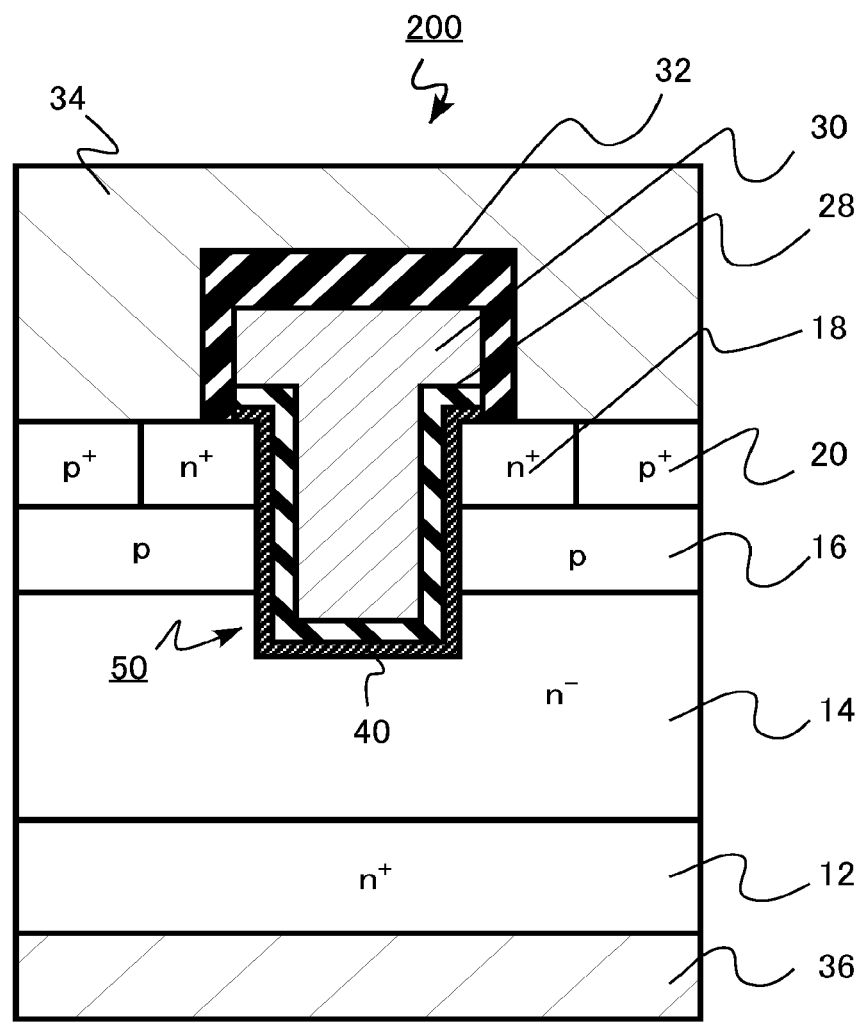
FIG. 14 is a cross-sectional view schematically illustrating a semiconductor device according to a sixth embodiment.

FIG. 14 is a cross-sectional view schematically illustrating the structure a MISFET which is the semiconductor device according to this embodiment. A MISFET 200 is a trench gate MISFET in which a gate insulating film and a gate electrode are provided in a trench.

The MISFET 200 includes an n⁺ SiC substrate 12 having first and second planes. In FIG. 14, the first plane is an upper plane and the second plane is a lower plane.

The SiC substrate 12 is, for example, a 4H—SiC substrate which has nitrogen (N) as n-type impurities and has an impurity concentration that is equal to or greater than $1 \times 10^{18}$ cm⁻³ and equal to or less than $1 \times 10^{20}$ cm⁻³.

An n⁻ SiC layer (a SiC semiconductor layer: a drift layer) 14 having an n-type impurity concentration that is equal to or greater than $5 \times 10^{15}$ cm⁻³ and equal to or less than $2 \times 10^{16}$ cm⁻³ is formed on the first plane of the SiC substrate 12. The drift layer 14 is, for example, an epitaxial growth layer that is formed on the SiC substrate 12 by epitaxial growth.

A surface of the drift layer 14 is inclined at an angle that is equal to or greater than 0 degrees and equal to or less than 8 degrees with respect to the silicon face. The thickness of the drift layer 14 is, for example, equal to or greater than 5 µm and equal to or less than 100 µm.

A p well region 16 of a p type which has a p-type impurity concentration that is, for example, equal to or greater than $5 \times 10^{15}$ cm⁻³ and equal to or less than $1 \times 10^{17}$ cm⁻³ is formed in a portion of the surface of the drift layer 14. The depth of the p well region 16 is, for example, about 0.6 µm. The p well region 16 functions as a channel region of the MISFET 200.

An n⁺ source region 18 having an n-type impurity concentration that is, for example, equal to or greater than $1 \times 10^{18}$ cm⁻³ and equal to or less than $1 \times 10^{22}$ cm⁻³ is formed in a portion of the surface of the p well region 16. The depth of the source region 18 is less than the depth of the p well region 16 and is, for example, about 0.3 µm.

A p well contact region 20 of a p⁺ type which has a p-type impurity concentration that is, for example, equal to or greater than $1 \times 10^{18}$ cm⁻³ and equal to or less than $1 \times 10^{22}$ cm⁻³ is formed on the side of the source region 18 in a portion of the surface of the p well region 16. The depth of the p well contact region 20 is less than the depth of the p well region 16 and is, for example, about 0.3 µm.

A trench 50 is provided in a direction from the surface of the drift layer 14 to the SiC substrate 12. The inner wall surface of the trench 50 is, for example, the M-face or the A-face.

A gate insulating film 28 is continuously formed on the surfaces of the drift layer 14, the p well region 16, and the source region 18 in the trench 50 so as to be laid across the layer and the regions.

Then, a gate electrode 30 is formed on the gate insulating film 28. The p well region 16 which is interposed between the source region 18 and the drift layer 14 on the side surface of the trench 50 functions as a channel region of the MISFET 200.

The gate insulating film 28 is provided between the gate electrode 30 and the drift layer 14. An interface region 40 is provided at the interface between the drift layer 14 and the gate insulating film 28. The interface region 40 includes at least one element (termination element) selected from the group consisting of Sb (antimony), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

A conductive source electrode 34 that is electrically connected to the source region 18 and the p well contact region 20 is provided. The source electrode 34 also functions as a p well electrode that gives potential to the p well region 16. A conductive drain electrode 36 is formed on a surface of the SiC substrate 12 opposite to the drift layer 14, that is, on the second plane.

The interface between the drift layer 14 and the gate insulating film 28 is the M-face or the A-face. Therefore, it is preferable that the interface region 40 includes nitrogen (N) in order to improve the stability of the interface region 40.

According to this embodiment, the interface region 40 makes it possible to obtain the same effect as that in the first embodiment. In addition, since the trench gate structure is used, it possible to improve the integration of the MISFET 200. Since a JFET region is absent, it is possible to reduce conduction loss.

(Seventh Embodiment)

A semiconductor device according to this embodiment is similar to the semiconductor device according to the first embodiment except that it is not a MISFET, but is an IGBT. Therefore, the description of the same content as that in the first embodiment will not be repeated.

Figure 15:
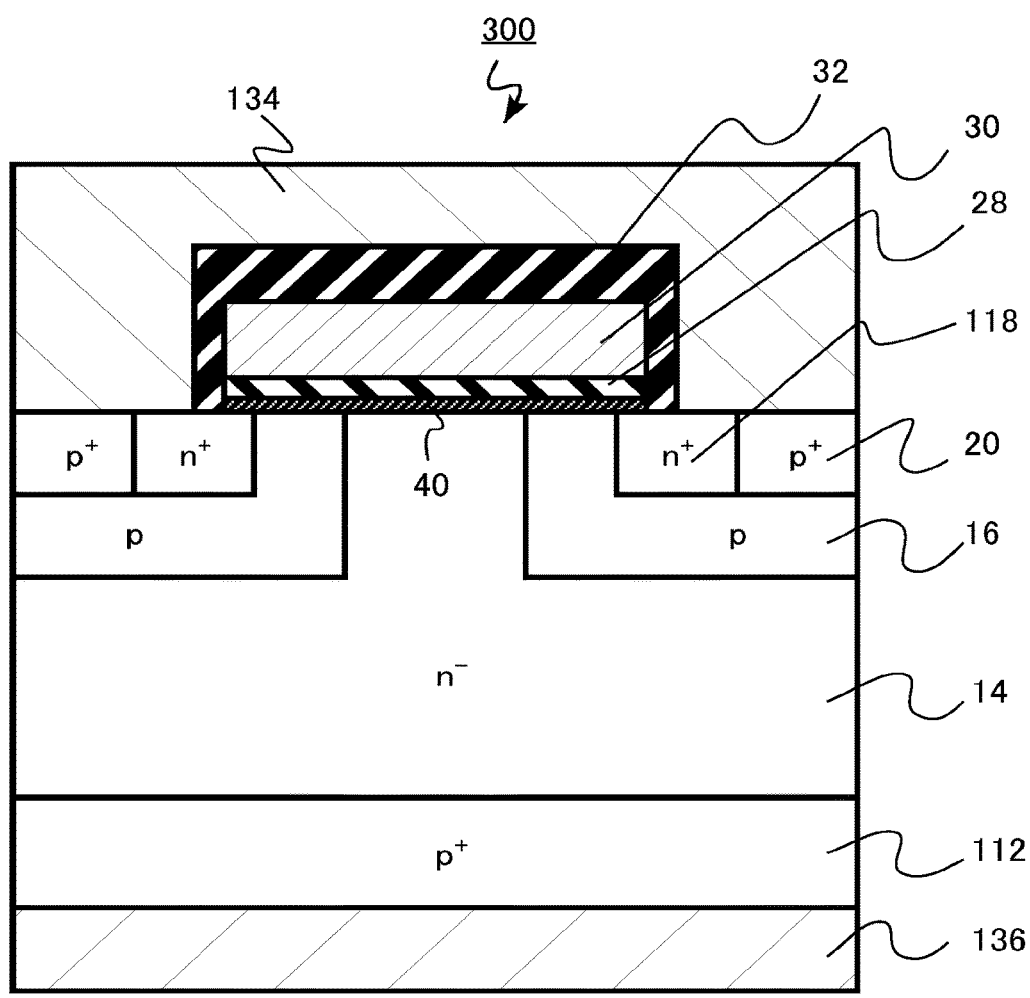
FIG. 15 is a cross-sectional view schematically illustrating a semiconductor device according to a seventh embodiment.

FIG. 15 is a cross-sectional view schematically illustrating an IGBT which is the semiconductor device according to this embodiment.

An IGBT 300 includes a SiC substrate 112 having first and second planes. In FIG. 15, the first plane is an upper plane and the second plane is a lower plane.

The SiC substrate 112 is, for example, a 4H—SiC substrate which has aluminum (Al) as p-type impurities and has an impurity concentration that is equal to or greater than $1 \times 10^{18}$ cm$^{-3}$ and equal to or less than $1 \times 10^{20}$ cm$^{-3}$.

Next, an example in which the first plane of the SiC substrate 112 is inclined at an angle that is equal to or greater than 0 degrees and equal to or less than 8 degrees with respect to the silicon face and the second plane thereof is inclined at an angle that is equal to or greater than 0 degrees and equal to or less than 8 degrees with respect to the carbon face will be described. The plane which is inclined at an angle that is equal to or greater than 0 degrees and equal to or less than 8 degrees with respect to the silicon face and the plane which is inclined at an angle that is equal to or greater than 0 degrees and equal to or less than 8 degrees with respect to the carbon face can be regarded to be substantially the same as the silicon face and the carbon face in terms of characteristics, respectively.

An n$^-$ SiC layer (a SiC semiconductor layer: a drift layer) 14 having an n-type impurity concentration that is equal to or greater than $5 \times 10^{15}$ cm$^{-3}$ and equal to or less than $2 \times 10^{16}$ cm$^{-3}$ is formed on the first plane of the SiC substrate 112. The drift layer 14 is, for example, an epitaxial growth layer that is formed on the SiC substrate 112 by epitaxial growth.

A surface of the drift layer 14 is inclined at an angle that is equal to or greater than 0 degrees and equal to or less than 8 degrees with respect to the silicon face. The thickness of the drift layer 14 is, for example, equal to or greater than 5 µm and equal to or less than 100 µm.

A p well region 16 of a p type which has a p-type impurity concentration that is, for example, equal to or greater than $5 \times 10^{15}$ cm$^{-3}$ and equal to or less than $1 \times 10^{17}$ cm$^{-3}$ is formed in a portion of the surface of the drift layer 14. The depth of the p well region 16 is, for example, about 0.6 µm. The p well region 16 functions as a channel region of the IGBT 300.

An n$^+$ emitter region 118 having an n-type impurity concentration that is, for example, equal to or greater than $1 \times 10^{18}$ cm$^{-3}$ and equal to or less than $1 \times 10^{22}$ cm$^{-3}$ is formed in a portion of the surface of the p well region 16. The depth of the emitter region 118 is less than the depth of the p well region 16 and is, for example, about 0.3 µm.

A p well contact region 20 of a p$^+$ type which has a p-type impurity concentration that is, for example, equal to or greater than $1 \times 10^{18}$ cm$^{-3}$ and equal to or less than $1 \times 10^{22}$ cm$^{-3}$ is formed on the side of the emitter region 118 in a portion of the surface of the p well region 16. The depth of the p well contact region 20 is less than the depth of the p well region 16 and is, for example, about 0.3 µm.

A gate insulating film 28 is continuously formed on the surfaces of the drift layer 14 and the p well region 16 so as to be laid across the layer and the region. For example, a silicon oxide film or a high-k insulating film can be applied to the gate insulating film 28. It is preferable to provide the silicon oxide film with a wider bandgap than the high-k insulating film in order to reduce the leakage current of the gate insulating film 28.

When an excessive amount of carbon (C) is present in the gate insulating film 28, there is a concern that level density which has an adverse effect on the characteristics of the device will increase. Therefore, the carbon (C) concentration of the gate insulating film 28 is preferably equal to or less than $1 \times 10^{18}$ cm$^{-3}$.

Then, a gate electrode 30 is formed on the gate insulating film 28. For example, polysilicon can be applied to the gate electrode 30. An interlayer insulating film 32 which is, for example, a silicon oxide film is formed on the gate electrode 30.

The p well region 16 which is interposed between the emitter region 118 and the drift layer 14 below the gate electrode 30 functions as a channel region of the IGBT 300.

The gate insulating film 28 is provided between the gate electrode 30 and the drift layer 14. An interface region 40 is provided at the interface between the drift layer 14 and the gate insulating film 28. The interface region 40 includes at least one element (termination element) selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu).

The termination element is segregate at the interface between the drift layer 14 and the gate insulating film 28. The thickness of the interface region 40 is preferably equal to or less than 5 nm. The thickness of the interface region 40 is defined by the full width at half maximum of the peak of the concentration distribution of the termination element.

The concentration of the termination element of the interface region 40 is equal to or greater than $1 \times 10^{19}$ cm$^{-3}$ and equal to or less than $2.4 \times 10^{22}$ cm$^{-3}$. The concentration of the termination element of the interface region 40 is preferably equal to or greater than $6.4 \times 10^{20}$ cm$^{-3}$ and equal to or less than $1.0 \times 10^{22}$ cm$^{-3}$. The concentration of the termination element of the interface region 40 can be measured by secondary ion mass spectrometry (SIMS).

The area density of the termination elements of the interface region 40 is equal to or greater than $1 \times 10^{12}$ cm$^{-2}$ and equal to or less than $2.4 \times 10^{15}$ cm$^{-2}$. The area density is preferably equal to or greater than $6.4 \times 10^{13}$ cm$^{-2}$ and equal to or less than $1.0 \times 10^{15}$ cm$^{-2}$.

The termination element of the interface region 40 substitutes silicon (Si) in the uppermost layer of the drift layer (SiC semiconductor layer) 14 to form a so-called termination structure. Since the termination element is present in the interface, the termination element is energetically stable. In addition, the concentration of the termination element in the drift layer (SiC semiconductor layer) 14 or the gate insulating film 28 is preferably lower than that at the interface in order to reduce level density that has an adverse effect on the characteristics of the device.

The full width at half maximum of the peak of the termination element is equal to or less than 5 nm and preferably equal to or less than 1 nm. Since Si in the outermost surface is substituted for termination, the full width at half maximum of the peak of the termination element can be theoretically equal to or less than 0.25 nm.

A conductive emitter electrode 134 that is electrically connected to the emitter region 118 and the p well contact region 20 is provided. The emitter electrode 134 also functions as a p well electrode that gives potential to the p well region 16.

The emitter electrode 134 includes, for example, a nickel (Ni) barrier metal layer and an aluminum (Al) metal layer 24 stacked on the barrier metal layer. An alloy may be formed by the reaction between the Ni barrier metal layer and the Al metal layer.

A conductive collector electrode 136 is formed on a surface of the SiC substrate 112 opposite to the drift layer 14, that is, on the second plane. The collector electrode 136 includes, for example, a nickel (Ni) barrier metal layer and the aluminum (Al) metal layer 24 stacked on the barrier metal layer. An alloy may be formed by the reaction between the Ni barrier metal layer and the Al metal layer.

In this embodiment, it is preferable that the n-type impurity be, for example, nitrogen (N) or phosphorus (P). However, the n-type impurity may be, for example, arsenic (As) or antimony (Sb). It is preferable that the p-type impurity be, for example, aluminum (Al). However, the p-type impurity may be, for example, boron (B), gallium (Ga), or indium (In).

According to this embodiment, since the interface region 40 is provided, it is possible to obtain the same function and effect as those in the first embodiment. Therefore, the IGBT 300 having a high operation performance and high reliability is achieved.

In the above-described embodiments, the crystal structure of silicon carbide is 4H—SiC. However, the invention can be applied to silicon carbide with other crystal structures such as 6H—SiC and 3C—SiC.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a SiC semiconductor layer;
a gate electrode;
a gate insulating film provided between the SiC semiconductor layer and the gate electrode; and
a region positioned at an interface between the SiC semiconductor layer and the gate insulating film, the region including a single component in which Si in SiC is replaced with at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) such that the component contacts the SiC semiconductor layer and the gate insulating film, that a concentration of the at least one element in the region is equal to or greater than $1\times10^{19}$ cm$^{-3}$ and equal to or less than $2.4\times10^{22}$ cm$^{-3}$ and that a peak of a concentration distribution of the at least one element is positioned in the region.

2. The device according to claim 1,
wherein a full width at half maximum of the peak of the concentration distribution of the at least one element is equal to or less than 5 nm.

3. The device according to claim 1,
wherein a plane of the SiC semiconductor layer facing the region is inclined at an angle equal to or greater than 0 degrees and equal to or less than 8 degrees with respect to one of a {0001} face, a {1-100} face, or a {11-20} face.

4. The device according to claim 1,
wherein a plane of the SiC semiconductor layer facing the region is inclined at an angle equal to or greater than 0 degrees and equal to or less than 8 degrees with respect to a {1-100} face or a {11-20} face, and
nitrogen (N) is included in the region.

5. The device according to claim 4,
wherein a concentration of nitrogen (N) in the region is higher than the concentration of the at least one element.

6. The device according to claim 1,
wherein the concentration of the at least one element is equal to or greater than $6.4\times10^{20}$ cm$^{-3}$ and equal to or less than $1.0\times10^{22}$ cm$^{-3}$.

7. The device according to claim 1,
wherein the gate insulating film is a silicon oxide film.

8. The device according to claim 1,
wherein a concentration of carbon (C) in the gate insulating film is equal to or less than $1\times10^{18}$ cm$^{-3}$.

9. The device according to claim 1, wherein the region is a monolayer.

10. A method for manufacturing a semiconductor device, comprising:
implanting ions of at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) into a SiC semiconductor layer;
forming a thermally oxidized film on a surface of the SiC semiconductor layer;
forming a gate insulating film on or above the surface of the SiC semiconductor layer; and
forming a gate electrode on the gate insulating film,
wherein the semiconductor device has a region positioned at an interface between the SiC semiconductor layer and the gate insulating film, the region including a single component in which Si in SiC is replaced with the at least one element such that the component contacts the SiC semiconductor layer and the gate insulating film, that a concentration of the at least one element in the region is equal to or greater than $1\times10^{19}$ cm$^{-3}$ and equal to or less than $2.4\times10^{22}$ cm$^{-3}$ and that a peak of a concentration distribution of the at least one element is positioned in the region.

11. The method according to claim 10, further comprising:
removing at least a part of the thermally oxidized film before the forming of the gate insulating film.

12. The method according to claim 10, further comprising:
forming an insulating film on the surface of the SiC semiconductor layer before the implanting of the ions.

13. A method for manufacturing a semiconductor device, comprising:
forming a film including at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu) on a surface of a SiC semiconductor layer;
forming a gate insulating film on or above the surface of the SiC semiconductor layer; and forming a gate electrode on the gate insulating film,
wherein the semiconductor device has a region positioned at an interface between the SiC semiconductor layer and the gate insulating film, the region including a single component in which Si in SiC is replaced with the at least one element such that the component contacts the SiC semiconductor layer and the gate insulating film, that a concentration of the at least one element in the region is equal to or greater than $1\times10^{19}$ cm$^{-3}$ and equal to or less than $2.4\times10^{22}$ cm$^{-3}$ and that a peak of a concentration distribution of the at least one element is positioned in the region.

14. The method according to claim 13, further comprising:
    oxidizing the film to form an oxide film before the forming of the gate insulating film.

15. The method according to claim 14, further comprising:
    removing at least a part of the oxide film before the forming of the gate insulating film.

16. The method according to claim 13, further comprising:
    oxynitriding the film to form an oxynitride film before the forming of the gate insulating film.

17. The method according to claim 16, further comprising:
    removing at least a part of the oxynitride film before the forming of the gate insulating film.

18. The method according to claim 13,
    wherein a plane of the SiC semiconductor layer facing the region is inclined at an angle equal to or greater than 0 degrees and equal to or less than 8 degrees with respect to a {1-100} face or a {11-20} face.

19. The method according to claim 13,
    wherein the film is a single-element film of the at least one element.

20. The method according to claim 13,
    wherein the film is a silicate film, and
    the method further comprises removing at least a part of the silicate film before the forming of the gate insulating film.

21. A semiconductor device, comprising:
    a SiC semiconductor layer;
    a gate electrode;
    a gate insulating film provided between the SiC semiconductor layer and the gate electrode; and
    a region provided between the SiC semiconductor layer and the gate insulating film, the region including a single component in which Si in SiC is replaced with at least one element selected from the group consisting of yttrium (Y) and lanthanum (La) such that the component contacts the SiC semiconductor layer and the gate insulating film, a concentration of the at least one element in the region being equal to or greater than $1\times10^{19}$ cm$^{-3}$ and equal to or less than $2.4\times10^{22}$ cm$^{-3}$.

22. The device according to claim 21,
    wherein a full width at half maximum of a peak of a concentration distribution of the at least one element is equal to or less than 5 nm.

23. The device according to claim 21,
    wherein a plane of the SiC semiconductor layer facing the region is inclined at an angle equal to or greater than 0 degrees and equal to or less than 8 degrees with respect to one of a {0001} face, a {1-100} face or a {11-20} face.

24. The device according to claim 21, wherein the region is a monolayer.

* * * * *